US 9,128,386 B2

(12) United States Patent
Chen

(10) Patent No.: US 9,128,386 B2
(45) Date of Patent: Sep. 8, 2015

(54) APPARATUS OF PHOTOLITHOGRAPHY PROCESS TO LIQUID DISPLAY PANEL AND METHOD THEREOF

(75) Inventor: Hsiao-Hsien Chen, Shenzhen (CN)

(73) Assignee: SHENZHEN CHINA STAR OPTOELECTRONICS TECHNOLOGY CO. LTD., Shenzhen (CN)

( * ) Notice: Subject to any disclaimer, the term of this patent is extended or adjusted under 35 U.S.C. 154(b) by 0 days.

(21) Appl. No.: 13/703,357

(22) PCT Filed: Aug. 16, 2012

(86) PCT No.: PCT/CN2012/080256
§ 371 (c)(1),
(2), (4) Date: Dec. 11, 2012

(87) PCT Pub. No.: WO2014/026368
PCT Pub. Date: Feb. 20, 2014

(65) Prior Publication Data
US 2015/0146181 A1    May 28, 2015

(30) Foreign Application Priority Data

Aug. 15, 2012 (CN) .......................... 2012 1 0290642

(51) Int. Cl.
*G03F 7/20* (2006.01)
*G02F 1/13* (2006.01)
*G02F 1/1337* (2006.01)

(52) U.S. Cl.
CPC .......... *G03F 7/70058* (2013.01); *G02F 1/1303* (2013.01); *G02F 1/133711* (2013.01); *G02F 1/133788* (2013.01); *G03F 7/70791* (2013.01); *G02F 2202/023* (2013.01); *G02F 2203/03* (2013.01)

(58) Field of Classification Search
CPC ................ G02F 1/1334; G02F 1/1303; G02F 2001/13775; G02F 1/1333; G02F 1/1339; H01L 51/56; G03F 7/22; G03F 7/70058
USPC ................... 349/86, 92–94, 117, 187; 430/20
See application file for complete search history.

(56) References Cited

U.S. PATENT DOCUMENTS

| 7,081,935 | B2 | 7/2006 | Chida et al. | |
|---|---|---|---|---|
| 2011/0157538 | A1* | 6/2011 | Lee | 349/190 |
| 2012/0125539 | A1* | 5/2012 | He et al. | 156/378 |
| 2013/0077039 | A1 | 3/2013 | Lee et al. | |

FOREIGN PATENT DOCUMENTS

| CN | 1869794 A | 11/2006 |
|---|---|---|
| CN | 102289107 A | 12/2011 |

(Continued)

Primary Examiner — Steven H Whitesell Gordon
(74) Attorney, Agent, or Firm — Mark M. Friedman

(57) ABSTRACT

The present invention discloses an apparatus of photolithography process to a liquid display panel, comprising: a platform, employed for loading the liquid display panel; a power supplying device, employed for supplying power to the liquid display panel; an ultraviolet light source supply device, employed for providing the ultraviolet light; a light distributing plate, employed for homogenizing the ultraviolet light. The present invention also discloses a method of photolithography process to a liquid display panel. The monomer can plenty reacts without damaging liquid crystal molecules according to the present invention.

2 Claims, 2 Drawing Sheets

(56) References Cited

FOREIGN PATENT DOCUMENTS

| JP | 1999133387 | A |   | 5/1999 |
| JP | 20080866890 | A |   | 4/2008 |
| JP | 2008116672 | A | * | 5/2008 |

* cited by examiner

APPARATUS OF PHOTOLITHOGRAPHY PROCESS TO LIQUID DISPLAY PANEL AND METHOD THEREOF

BACKGROUND OF THE INVENTION

1. Field of the Invention

The present invention generally relates to a display apparatus field, and more particularly to an apparatus of photolithography process to a liquid display panel and a method thereof.

2. Description of Prior Art

In a traditional manufacture process of a liquid display panel, the liquid crystal molecules on PI (Polymer) surface with a consistent predetermined tilt angle is described below:

Monomer is mixed with liquid crystal molecules and then the liquid display panel is electrified to cause the liquid crystal molecules with a predetermined tilt angle. Ultraviolet light is employed to irradiate the monomer. The monomer is solidified on the PI surface. Accordingly, the liquid crystal molecules on the PI surface are maintained with a certain angle.

In the foregoing technical solution, the liquid crystal molecules and the monomer are mixed together. In the process of utilizing the ultraviolet light to irradiate the monomer, the liquid crystal molecules are also irradiated by the ultraviolet light. The liquid crystal molecules are therefore damaged and lose the properties of the liquid crystal molecules.

The consequences of the damaging the liquid crystal molecules by the ultraviolet light irradiation are very severe. The display quality of the liquid display panel can be terrible. Even the liquid display panel may be abandoned to result in enormous waste. It is seriously disadvantageous to the industrialization of the liquid display panel.

Therefore, an apparatus of photolithography process to a liquid display panel, in which the monomer can plenty react under the irradiation of the ultraviolet light and the damage of the ultraviolet light to the liquid crystal molecules also can be prevented.

Moreover, for meeting demands of photolithography processes to the liquid display panels of different sizes and reducing the power consumption of the photolithography process to the liquid display panel, it is necessary to adjust the area of the photolithography process according to the actual size of the liquid display panel.

Consequently, there is a need to provide a new technical solution to solve the aforesaid problems.

SUMMARY OF THE INVENTION

An objective of the present invention is to provide an apparatus of photolithography process to a liquid display panel, in which the monomer mixed with liquid crystal molecules can plenty react under the irradiation of the ultraviolet light and the damage of the ultraviolet light to the liquid crystal molecules also can be prevented.

For solving the aforesaid problems, the present invention provides an apparatus of photolithography process to a liquid display panel, comprising: a platform, employed for loading the liquid display panel; a power supplying device, employed for supplying power to the liquid display panel to cause liquid crystal molecules of the liquid display panel with a predetermined tilt angle; an ultraviolet light source supply device, employed for generating ultraviolet light and providing the ultraviolet light to the liquid display panel; a light distributing plate, positioned between the platform and the ultraviolet light source supply device and employed for homogenizing the ultraviolet light; the ultraviolet light source supply device comprises a plurality of ultraviolet light light-emitting diode lamps, and the plurality of ultraviolet light light-emitting diode lamps are arranged as an ultraviolet light light-emitting diode lamp array, and the ultraviolet light light-emitting diode lamp array is employed for generating the ultraviolet light with a predetermined wavelength; the side of the ultraviolet light source supply device generating the ultraviolet light faces the side of the platform loading the liquid display panel, and the light distributing plate is transparent and positioned near side of the ultraviolet light source supply device generating the ultraviolet light.

In the aforementioned apparatus of photolithography process to a liquid display panel, the apparatus further comprises: a controller, employed for controlling power switch of the ultraviolet light source supply device.

In the aforementioned apparatus of photolithography process to a liquid display panel, the controller is further employed for powering on the ultraviolet light source supply device as the power supplying device supplies power to the liquid display panel to irradiate the liquid display panel by the ultraviolet light when the liquid crystal molecules are at the predetermined tilt angle.

In the aforementioned apparatus of photolithography process to a liquid display panel, the ultraviolet light light-emitting diode lamp array comprises at least a first light source generating portion and a second light source generating portion, and the first light source generating portion and a second light source generating portion are composed by the ultraviolet light light-emitting diode lamps.

In the aforementioned apparatus of photolithography process to a liquid display panel, the controller comprises at least a first sub controller and a second sub controller, and the first sub controller is employed for controlling power switch of the first light source generating portion when the liquid crystal molecules are at the predetermined tilt angle and the second sub controller is employed for controlling power switch of the second light source generating portion when the liquid crystal molecules are at the predetermined tilt angle.

Another objective of the present invention is to provide an apparatus of photolithography process to a liquid display panel, in which the monomer mixed with liquid crystal molecules can plenty react under the irradiation of the ultraviolet light and the damage of the ultraviolet light to the liquid crystal molecules also can be prevented.

For solving the aforesaid problems, the present invention provides an apparatus of photolithography process to a liquid display panel, comprising: a platform, employed for loading the liquid display panel; a power supplying device, employed for supplying power to the liquid display panel to cause liquid crystal molecules of the liquid display panel with a predetermined tilt angle; an ultraviolet light source supply device, employed for generating ultraviolet light and providing the ultraviolet light to the liquid display panel; a light distributing plate, positioned between the platform and the ultraviolet light source supply device and employed for homogenizing the ultraviolet light.

In the aforementioned apparatus of photolithography process to a liquid display panel, the ultraviolet light source supply device comprises a plurality of ultraviolet light light-emitting diode lamps, and the plurality of ultraviolet light light-emitting diode lamps are arranged as an ultraviolet light light-emitting diode lamp array, and the ultraviolet light light-emitting diode lamp array is employed for generating the ultraviolet light with a predetermined wavelength.

In the aforementioned apparatus of photolithography process to a liquid display panel, the apparatus further comprises:

a controller, employed for controlling power switch of the ultraviolet light source supply device.

In the aforementioned apparatus of photolithography process to a liquid display panel, the controller is further employed for powering on the ultraviolet light source supply device as the power supplying device supplies power to the liquid display panel to irradiate the liquid display panel by the ultraviolet light when the liquid crystal molecules are at the predetermined tilt angle.

In the aforementioned apparatus of photolithography process to a liquid display panel, the controller comprises at least a first sub controller and a second sub controller, and the ultraviolet light light-emitting diode lamp array comprises at least a first light source generating portion and a second light source generating portion, and the first light source generating portion and a second light source generating portion are composed by the ultraviolet light light-emitting diode lamps, and the first sub controller is employed for controlling power switch of the first light source generating portion when the liquid crystal molecules are at the predetermined tilt angle and the second sub controller is employed for controlling power switch of the second light source generating portion when the liquid crystal molecules are at the predetermined tilt angle.

Another objective of the present invention is to provide method of photolithography process to a liquid display panel, in which the monomer mixed with liquid crystal molecules can plenty react under the irradiation of the ultraviolet light and the damage of the ultraviolet light to the liquid crystal molecules also can be prevented.

For solving the aforesaid problems, the present invention provides a method of photolithography process to a liquid display panel. The method comprises steps of: (A) loading the liquid display panel by a platform; (B) supplying power to the liquid display panel to cause liquid crystal molecules of the liquid display panel with a predetermined tilt angle by a power supplying device; (C) generating ultraviolet light by an ultraviolet light source supply device; (D) homogenizing the ultraviolet light by a light distributing plate positioned between the platform and the ultraviolet light source supply device and providing the ultraviolet light which has been homogenized to the liquid display panel.

In the aforementioned method of photolithography process to a liquid display panel, the ultraviolet light source supply device comprises a plurality of ultraviolet light light-emitting diode lamps, and the plurality of ultraviolet light light-emitting diode lamps are arranged as an ultraviolet light light-emitting diode lamp array, the step (C) further comprising a step of: (c1) generating the ultraviolet light with a predetermined wavelength by the ultraviolet light light-emitting diode lamp array.

In the aforementioned method of photolithography process to a liquid display panel, the apparatus further comprises a controller; the method further comprising a step of: (E) controlling power switch of the ultraviolet light source supply device by the controller.

In the aforementioned method of photolithography process to a liquid display panel, the step (E) further comprises a step of: (e1) powering on the ultraviolet light source supply device by the controller as the power supplying device supplies power to the liquid display panel to irradiate the liquid display panel by the ultraviolet light when the liquid crystal molecules are at the predetermined tilt angle.

In the aforementioned method of photolithography process to a liquid display panel, the controller comprises at least a first sub controller and a second sub controller, and the ultraviolet light light-emitting diode lamp array comprises at least a first light source generating portion and a second light source generating portion, and the first light source generating portion and a second light source generating portion are composed by the ultraviolet light light-emitting diode lamps; the step (e1) further comprising steps of: (e11) controlling power switch of the first light source generating portion by the first sub controller when the liquid crystal molecules are at the predetermined tilt angle; (e12) controlling power switch of the second light source generating portion by the second sub controller when the liquid crystal molecules are at the predetermined tilt angle.

Comparing with prior arts, the photolithography process can be proceeded to the liquid display panel according to the present invention by equipping the platform, the ultraviolet light source supply device, the light distributing plate, the controller and the power supplying device. Besides, due to the wavelength of the ultraviolet light generated by the ultraviolet light light-emitting diode lamps is relatively concentrated, therefore, the monomer mixed with liquid crystal molecules can plenty react under the irradiation of the ultraviolet light and the damage of the ultraviolet light to the liquid crystal molecules also can be prevented because of the ultraviolet light generated by the ultraviolet light light-emitting diode lamps in the present invention. Meanwhile, by utilizing the ultraviolet light light-emitting diode lamps to provide the ultraviolet light, the ultraviolet light light-emitting diode lamps can be powered on and instantly get into in-service condition. That is, the ultraviolet light light-emitting diode lamps immediately generate the ultraviolet light with the predetermined wavelength rather than the ultraviolet light 104 with a gradually changing wavelength and the preheating becomes unnecessary, either. Therefore, it is beneficial for providing a steady and precise ultraviolet light to the liquid display panel 105. Furthermore, the life time of the ultraviolet light light-emitting diode lamps is longer up to tens thousand of hours. The useful time of the apparatus of photolithography process to a liquid display panel according to the present invention can be promoted.

For a better understanding of the aforementioned content of the present invention, preferable embodiments are illustrated in accordance with the attached figures for further explanation.

DETAILED DESCRIPTION OF THE INVENTION

The following descriptions for the respective embodiments are specific embodiments capable of being implemented for illustrations of the present invention with referring to appended figures.

Figure 1:
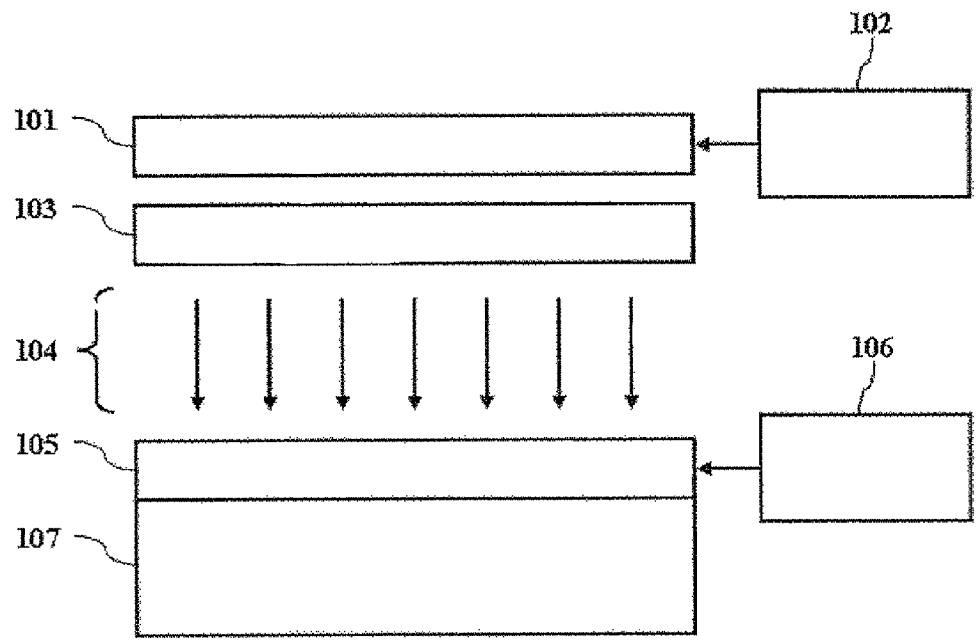
FIG. 1 depicts a diagram of an apparatus of photolithography process to a liquid display panel in-service condition according to the present invention.

Please refer to FIG. 1, which depicts a diagram of an apparatus of photolithography process to a liquid display panel in-service condition according to the present invention. The apparatus of photolithography process to a liquid display panel according to the present invention comprises a platform 107, an ultraviolet light source supply device 101, a light distributing plate (Fly Eye) 103 and a power supplying device 106. The power supplying device 106 is electrically connected to the liquid display panel 105. The platform 107 is employed for loading a liquid display panel 105. The side of the ultraviolet light source supply device 101 generating the ultraviolet light faces the side of the platform 107 loading the liquid display panel 105. The light distributing plate 103 is positioned between the platform 107 and the ultraviolet light source supply device 101. Specifically, the light distributing plate 103 is positioned near the side of the ultraviolet light source supply device 101 generating the ultraviolet light. The power supplying device 106 is employed for providing a predetermined voltage to the liquid display panel 105 to cause liquid crystal molecules of the liquid display panel 105 to be twisted to reach a predetermined tilt angle. The ultraviolet light source supply device 101 is employed for generating ultraviolet light and providing the ultraviolet light 104 to the liquid display panel 105. The ultraviolet light 104 is employed for proceeding the photolithography process to the liquid display panel 105. The light distributing plate 103 is transparent and employed for homogenizing the ultraviolet light 104. Then, the ultraviolet light 104 generated by the ultraviolet light source supply device 101 does not be focused on any partial area of the liquid display panel 105 and beneficial to the liquid crystal molecules of the liquid display panel 105 on PI surface to be with a consistent predetermined tilt angle.

The apparatus of photolithography process to a liquid display panel according the present invention also can further comprise a controller 102. The controller 102 is electrically connected to the ultraviolet light source supply device 101 and employed for controlling power switch of the ultraviolet light source supply device 101. The controller 102 is employed for controlling the ultraviolet light source supply device 101 to generate the ultraviolet light or not generate the ultraviolet light. Specifically, the controller 102 is employed for powering on the ultraviolet light source supply device 101 as the power supplying device 106 supplies power to the liquid display panel 105. The ultraviolet light source supply device 101 generates the ultraviolet light 104 to irradiate the liquid display panel 105 when the liquid crystal molecules are at the predetermined tilt angle.

Figure 2:
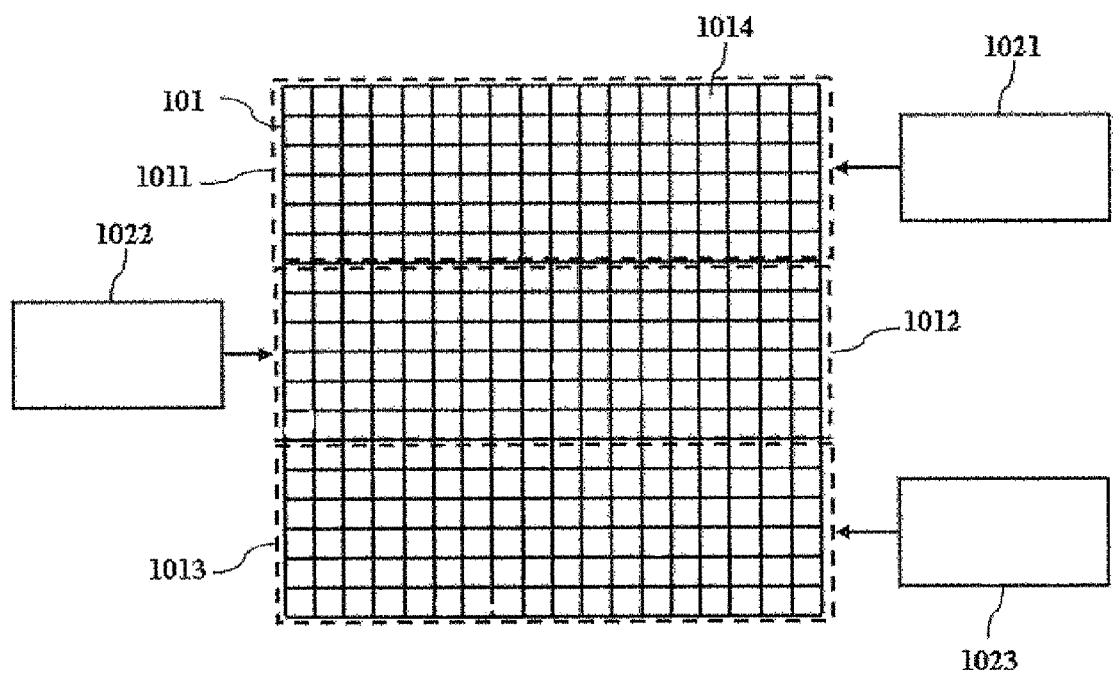
FIG. 2 depicts a diagram of how a controller controls an ultraviolet light source supply device shown in FIG. 1.

For realizing that the monomer mixed with liquid crystal molecules can plenty react under the irradiation of the ultraviolet light 104 and the damage of the ultraviolet light 104 to the liquid crystal molecules also can be prevented, the ultraviolet light source supply device 101 of the present invention comprises a plurality of UVLED (ultraviolet light light-emitting diode lamps) 1014. As shown in FIG. 2, the ultraviolet light 104 is provided by the ultraviolet light light-emitting diode lamps 1014. The wavelength of the ultraviolet light 104 generated by the ultraviolet light light-emitting diode lamps 1014 can be determined by chips thereof and the wavelength is relatively concentrated. Therefore, the applicable wavelength for the ultraviolet light light-emitting diode lamps 1014 of the present invention can be selected thereby so that the ultraviolet light 104 generated by the ultraviolet light light-emitting diode lamps 1014 can cause the monomer to be plenty reacted and prevent the liquid crystal molecules from damage.

Because the ultraviolet light light-emitting diode lamps 1014 are utilized to provide the ultraviolet light 104 and the ultraviolet light light-emitting diode lamps 1014 can be powered on and instantly get into in-service condition, that is, the ultraviolet light light-emitting diode lamps 1014 are capable of immediately generating the ultraviolet light 104 with the predetermined wavelength rather than the ultraviolet light with a gradually changing wavelength and the preheating is unnecessary, either. Therefore, it is beneficial for providing a steady and precise ultraviolet light to the liquid display panel 105. Furthermore, the life time of the ultraviolet light light-emitting diode lamps 1014 is longer up to tens thousand of hours. The useful time of the apparatus of photolithography process to a liquid display panel according to the present invention can be promoted.

Please refer to FIG. 2, which depicts a diagram of how a controller 102 controls an ultraviolet light source supply device 101 shown in FIG. 1. The plurality of ultraviolet light light-emitting diode lamps 1014 are arranged as an ultraviolet light light-emitting diode lamp array. The ultraviolet light light-emitting diode lamp array is employed for generating the ultraviolet light 104 with a predetermined wavelength. The ultraviolet light light-emitting diode lamp array comprises at least two light source generating portions. The controller 102 comprises at least a first sub controller 1021 and a second sub controller 1022. As shown in FIG. 2, the ultraviolet light light-emitting diode lamp array comprises at least a first light source generating portion 1011, a second light source generating portion 1012 and a third light source generating portion 1013. The first light source generating portion 1011, the second light source generating portion 1012 and the third light source generating portion 1013 are composed by the ultraviolet light light-emitting diode lamps 1014. The controller 102 comprises the first sub controller 1021, the second sub controller 1022 and a third sub controller 1023. The first sub controller 1021, the second sub controller 1022 and the third sub controller 1023 are electrically connected to the first light source generating portion 1011, the second light source generating portion 1012 and the third light source generating portion 1013, respectively and independently control the first light source generating portion 1011, the second light source generating portion 1012 and the third light source generating portion 1013. The first sub controller 1021, the second sub controller 1022 and the third sub controller 1023 are respectively employed to control power switches of the first light source generating portion 1011, the second light source generating portion 1012 and the third light source generating portion 1013 when the liquid crystal molecules are at the predetermined tilt angle. In the operation progress of the ultraviolet light source supply device 101, at least one of the first light source generating portion 1011, the second light source generating portion 1012 and the third light source generating portion 1013 is in power-on condition. Furthermore, as considering the improvement, each of the ultraviolet light light-emitting diode lamps 1014 can be assigned to an independent sub controller and controlled thereby. Namely, each of the aforesaid light source generating portions (the first light source generating portion 1011, the second light source generating portion 1012 and the third light source generating portion 1013) can actually be one single ultraviolet light light-emitting diode lamp 1014. Accordingly, the irradiation area of the ultraviolet light source supply device 101 can be precisely controlled to meet demands of photolithography processes to the liquid display panels of different sizes. Meanwhile, it is also beneficial for saving the power consumption of the ultraviolet light source supply device 101 and decreasing unnecessary energy waste.

Figure 3:
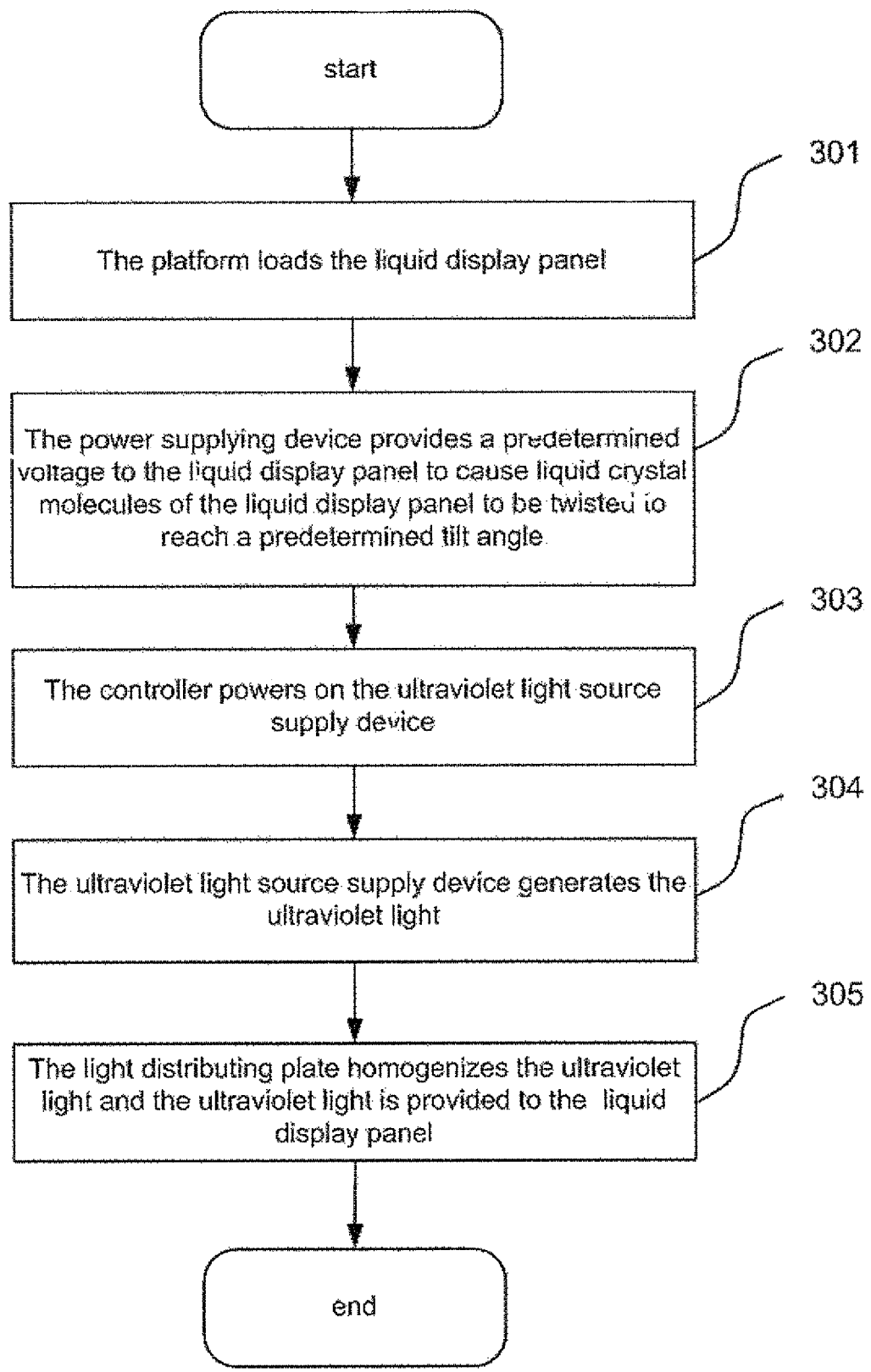
FIG. 3 shows a flowchart of a method of photolithography process to a liquid display panel according to the present invention.

Please refer to FIG. 3. FIG. 3 shows a flowchart of a method of photolithography process to a liquid display panel according to the present invention. The method of photolithography process to a liquid display panel according to the present invention is applicable to the apparatus of photolithography process to a liquid display panel according to the present invention. The apparatus of photolithography process to a liquid display panel according to the present invention comprises a platform 107, an ultraviolet light source supply device 101, a light distributing plate 103 and a power supplying device 106. The power supplying device 106 is electrically connected to the liquid display panel 105. The controller 102 is electrically connected to the ultraviolet light source supply device 101. The platform 107 is employed for loading a liquid display panel 105. The side of the ultraviolet light source supply device 101 generating the ultraviolet light 104 faces the side of the platform 107 loading the liquid display panel 105. The light distributing plate 103 is positioned between the platform 107 and the ultraviolet light source supply device 101. Specifically, the light distributing plate 103 is positioned near the side of the ultraviolet light source supply device 101 generating the ultraviolet light 104. The ultraviolet light source supply device 101 comprises a plurality of ultraviolet light light-emitting diode lamps 1014, and the plurality of ultraviolet light light-emitting diode lamps 1014 are arranged as an ultraviolet light light-emitting diode lamp array. The ultraviolet light light-emitting diode lamp array is employed for generating the ultraviolet light 104 with a predetermined wavelength. The controller 102 comprises at least a first sub controller 1021 and a second sub controller 1022. The ultraviolet light light-emitting diode lamp array comprises at least a first light source generating portion 1011 and a second light source generating portion 1012. The first light source generating portion 1011 and the second light source generating portion 1012 are composed by the ultraviolet light light-emitting diode lamps 1014.

In Step 301, the liquid display panel 105 is loaded on the platform 107. That is, the platform 107 loads the liquid display panel 105.

In Step 302, the power supplying device 106 is connected to the liquid display panel 105. The power supplying device 106 provides a predetermined voltage to the liquid display panel 105 to cause liquid crystal molecules of the liquid display panel 105 to be twisted to reach a predetermined tilt angle.

In Step 303, the controller 102 powers on the ultraviolet light source supply device 101. Specifically, the controller 102 powers on the ultraviolet light source supply device 101 as the power supplying device 106 supplies power to the liquid display panel 105. The ultraviolet light 104 irradiates the liquid display panel 105 when the liquid crystal molecules are at the predetermined tilt angle. Moreover, an area of the photolithography process to the liquid display panel 105 is determined in advance. When the liquid crystal molecules are at the predetermined tilt angle, the first sub controller 1021 of the controller 102 is employed to control the power switch of the first light source generating portion 1011 of the ultraviolet light source supply device 101, and the second sub controller 1022 of the controller 102 is employed to control the power switch of the second light source generating portion 1012 of the ultraviolet light source supply device 101. In the period of that the liquid crystal molecules of the liquid display panel 105 are at the predetermined tilt angle, at least one of the first light source generating portion 1011 and the second light source generating portion 1012 is in power-on condition. In the method of photolithography process to a liquid display panel according to the present invention, the controller 102 can be employed to control the power switch of portions of the ultraviolet light source supply device 101 to set up or adjust the area of the photolithography process to liquid display panel 105. Furthermore, in the ultraviolet light light-emitting diode lamp array, each of the ultraviolet light light-emitting diode lamps 1014 can be assigned to an independent sub controller and controlled thereby. Namely, each of the aforesaid light source generating portions (the first light source generating portion 1011, the second light source generating portion 1012 and the third light source generating portion 1013) can actually be one single ultraviolet light light-emitting diode lamp 1014. Accordingly, the irradiation area of the ultraviolet light source supply device 101 can be precisely controlled to meet demands of photolithography processes to the liquid display panels of different sizes. Meanwhile, it is also beneficial for saving the power consumption of the ultraviolet light source supply device 101 and decreasing unnecessary energy waste.

In Step 304, the ultraviolet light source supply device 101 generates the ultraviolet light 104 and provides the ultraviolet light 104 to the liquid display panel 105. Specifically, at least one of the first light source generating portion 1011 and the second light source generating portion 1012 generates the ultraviolet light 104 and provides the ultraviolet light 104 to the liquid display panel 105.

In Step 305, the light distributing plate 103 homogenizes the ultraviolet light 104. Then, the ultraviolet light 104 does not be focused on any partial area of the liquid display panel 105.

Due to the wavelength of the ultraviolet light 104 generated by the ultraviolet light light-emitting diode lamps 1014 is relatively concentrated, therefore, the monomer mixed with liquid crystal molecules can plenty react and the damage of the ultraviolet light 104 to the liquid crystal molecules also can be prevented because of the ultraviolet light 104 generated by the ultraviolet light light-emitting diode lamps 1014 in the present invention. Meanwhile, by utilizing the ultraviolet light light-emitting diode lamps 1014 to provide the ultraviolet light 104, the ultraviolet light light-emitting diode lamps 1014 can be powered on and instantly get into in-service condition. That is, the ultraviolet light light-emitting diode lamps 1014 immediately generate the ultraviolet light 104 with the predetermined wavelength rather than the ultraviolet light 104 with a gradually changing wavelength and the preheating becomes unnecessary, either. Therefore, it is beneficial for providing a steady and precise ultraviolet light to the liquid display panel 105. Furthermore, the life time of the ultraviolet light light-emitting diode lamps is longer up to tens thousand of hours. The useful time of the apparatus of photolithography process to a liquid display panel according to the present invention can be promoted.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An apparatus of photolithography process to a liquid display panel, comprising:
a platform, employed for loading the liquid display panel;
a power supplying device, employed for supplying power to the liquid display panel to cause liquid crystal molecules of the liquid display panel with a predetermined tilt angle;
an ultraviolet light source supply device, employed for generating ultraviolet light and providing the ultraviolet light to the liquid display panel;
a light distributing plate, positioned between the platform and the ultraviolet light source supply device and employed for homogenizing the ultraviolet light;
the ultraviolet light source supply device comprises a plurality of ultraviolet light light-emitting diode lamps, and the plurality of ultraviolet light light-emitting diode lamps are arranged as an ultraviolet light light-emitting diode lamp array, and the ultraviolet light light-emitting diode lamp array is employed for generating the ultraviolet light with a predetermined wavelength;

the side of the ultraviolet light source supply device generating the ultraviolet light faces the side of the platform loading the liquid display panel, and the light distributing plate is transparent and positioned near the side of the ultraviolet light source supply device generating the ultraviolet light;

a controller, employed for controlling power switch of the ultraviolet light source supply device;

wherein the controller is further employed for powering on the ultraviolet light source supply device as the power supplying device supplies power to the liquid display panel to irradiate the liquid display panel by the ultraviolet light when the liquid crystal molecules are at the predetermined tilt angle, the ultraviolet light light-emitting diode lamp array comprises at least a first light source generating portion and a second light source generating portion, and the first light source generating portion and a second light source generating portion are composed by the ultraviolet light light-emitting diode lamps, the controller comprises at least a first sub controller and a second sub controller and the first sub controller is employed for controlling power switch of the first light source generating portion when the liquid crystal molecules are at the predetermined tilt angle and the second sub controller is employed for controlling power switch of the second light source generating portion when the liquid crystal molecules are at the predetermined tilt angle.

2. A method of photolithography process to a liquid display panel, wherein the method comprises steps of:

(A) loading the liquid display panel by a platform;

(B) supplying power to the liquid display panel to cause liquid crystal molecules of the liquid display panel with a predetermined tilt angle by a power supplying device;

(C) generating ultraviolet light by an ultraviolet light source supply device;

(D) homogenizing the ultraviolet light by a light distributing plate positioned between the platform and the ultraviolet light source supply device and providing the ultraviolet light which has been homogenized to the liquid display panel;

wherein the ultra violet light source supply device comprises a plurality of ultraviolet light light-emitting diode lamps, and the plurality of ultraviolet light light-emitting diode lamps are arranged as an ultraviolet light light-emitting diode lamp array, the step (C) further comprising a step of:

(c1) generating the ultraviolet light with a predetermined wavelength by the ultraviolet light light-emitting diode lamp array;

the method further comprising a set of:

(E) controlling power switch of the ultraviolet light source supply device by a controller;

wherein the step (E) further comprises a step of:

(e1) powering on the ultraviolet light source supply device by the controller as the power supplying device supplies power to the liquid display panel to irradiate the liquid display panel by the ultraviolet light when the liquid crystal molecules are the predetermined tilt angle, wherein the controller comprises at least a first sub controller and a second sub controller, and the ultraviolet light light-emitting diode lamp array comprises at least a first light source generating portion and a second light source generating portion, and the first light source generating portion and a second light source generating portion are composed by the ultraviolet light light-emitting diode lamps;

the step (e1) further comprising steps of:

(e11) controlling power switch of the first light source generating portion by the first sub controller when the liquid crystal molecules are at the predetermined tilt angle;

(e12) controlling power switch of the second light source generating portion by the second sub controller when the liquid crystal molecules are at the predetermined tilt angle.

* * * * *